United States Patent
Seliuchenko

(10) Patent No.: US 11,990,556 B2
(45) Date of Patent: May 21, 2024

(54) PHOTONIC MIXER DEVICE

(71) Applicant: Melexis Technologies NV, Tessenderlo (BE)

(72) Inventor: Volodymyr Seliuchenko, Nashua, NH (US)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 392 days.

(21) Appl. No.: 17/314,417

(22) Filed: May 7, 2021

(65) Prior Publication Data

US 2021/0351309 A1 Nov. 11, 2021

(30) Foreign Application Priority Data

May 8, 2020 (EP) ..................................... 20173636

(51) Int. Cl.
| | |
|---|---|
| *H01L 31/0352* | (2006.01) |
| *G01S 7/4865* | (2020.01) |
| *G01S 17/06* | (2006.01) |
| *G01S 17/894* | (2020.01) |
| *H01L 27/146* | (2006.01) |

(52) U.S. Cl.
CPC ........ *H01L 31/0352* (2013.01); *G01S 7/4865* (2013.01); *G01S 17/06* (2013.01); *G01S 17/894* (2020.01); *H01L 27/14643* (2013.01)

(58) Field of Classification Search
None
See application file for complete search history.

(56) References Cited

U.S. PATENT DOCUMENTS 6,987,268 B2   1/2006   Kuijk et al.
2011/0255071 A1 * 10/2011 Van Der Tempel .. H01L 31/101
                                                       257/E27.15

(Continued)

FOREIGN PATENT DOCUMENTS

EP   1513202 A1   3/2005
EP   2330637 A2   6/2011

OTHER PUBLICATIONS

Hollauer, C. (Dec. 5, 2007). Isolation Techniques . https://www.jue.tuwien.ac.at/phd/hollauer/node7.html (Year: 2007).*

(Continued)

*Primary Examiner* — Evren Seven
*Assistant Examiner* — Cole Leon Lindsey
(74) *Attorney, Agent, or Firm* — Workman Nydegger

(57) ABSTRACT

A photonic mixer device for multiplying an impinging optical signal with a reference electrical signal includes: a semiconductor substrate of a first conductivity type; two detector regions of a second conductivity type different from the first conductivity type; two biasing regions of the first conductivity type with a higher dopant concentration than the dopant concentration of the semiconductor substrate, each biasing region positioned near one of the respective detector regions, wherein an electrical field can be formed in the semiconductor substrate by applying a voltage bias between the biasing regions; two bias electrodes, which are isolated from the substrate and the biasing regions, wherein each bias electrode is only locally, partially or completely, covering an outer edge of one of the respective biasing regions.

14 Claims, 6 Drawing Sheets

(56) References Cited

U.S. PATENT DOCUMENTS

2015/0001664 A1* 1/2015 Van Der Tempel ........................ H01L 27/14645
257/432
2017/0194367 A1* 7/2017 Fotopoulou ............. H01L 31/11

OTHER PUBLICATIONS

Extended European Search Report from corresponding European Application No. 20173636.0, Oct. 26, 2020.

* cited by examiner

PHOTONIC MIXER DEVICE

FIELD OF THE INVENTION

The present invention relates to photonic devices. More specifically it relates to photonic mixer devices.

BACKGROUND OF THE INVENTION

A current-assisted photonic demodulator (CAPD) is a photo detector device that is also capable of noiseless multiplying of an impinging optical signal and a reference electrical signal. Therefore it is capable of estimating the correlation function between these signals.

The general idea of the CAPD is illustrated in FIG. 1 and is disclosed in U.S. Pat. No. 6,987,268B2. In this example, the photo detector is built in a lowly doped p-type substrate (labelled "p−"). The CAPD is composed of a substrate resistor formed between two p regions (labelled "p+") and two n regions (labelled "n+") located in close proximity to the p regions.

When a voltage source is connected to these p+ regions, a majority hole current will flow through the substrate resistor creating a gradual voltage drop and, therefore, an electric field in the silicon substrate. Light, incident on this device from the top or bottom, is absorbed in the substrate creating electron hole pairs. The photo electrons are drifting along the electric field lines towards the p region with a higher potential creating a pool of electrons around the p region.

These photoelectrons cannot penetrate into the p region because of a potential barrier stemming from the doping difference between the highly doped p region and a lowly doped p substrate.

This electron pool can be drained by placing an n doped region near the p doped region. Therefore, the minority carrier electron current stemming from photogeneration can be measured separately from the majority hole electrical current which assists in creating an electrical drift field in the substrate. Because of such separation, there is no extra thermal or shot noise contribution from the majority substrate current. By changing the polarity of the voltage source connected to the p regions, the flow of the photocurrent can be directed either to one or the other n region.

Using such a CAPD, sensors with up to giga Hertz of demodulation speed should be feasible. These speeds are, however, not obtained because of non-idealities in the sensor.

There is, therefore, a need for photonic mixer devices wherein these non-idealities are improved such that a higher demodulation speed can be achieved.

SUMMARY OF THE INVENTION

It is an object of embodiments of the present invention to provide a good photonic mixer device.

The above objective is accomplished by a method and device according to the present invention.

In a first aspect embodiments of the present invention relate to a photonic mixer device for multiplying an impinging optical signal with a reference electrical signal. The photonic mixer device comprises:
- a semiconductor substrate of a first conductivity type,
- two detector regions of a second conductivity type different from the first conductivity type,
- two biasing regions of the first conductivity type with a higher dopant concentration than the dopant concentration of the semiconductor substrate, each biasing region placed near one of the respective detector regions, wherein an electrical field can be formed in the semiconductor substrate by applying a voltage bias between the biasing regions,
- two bias electrodes, which are isolated from the substrate and the biasing regions, wherein each bias electrode is only locally, partially or completely, covering an outer edge of one of the respective biasing regions.

It is found by the inventor that charge pockets are present in the electrostatic potential between the biasing regions. It is, moreover, found that these charge pockets are present underneath the outer edges of the biasing regions. It is an advantage of embodiments of the present invention that these charge pockets can be reduced by applying a bias voltage on the bias electrodes. A negative bias voltage should be applied when the first conductivity type is p-type, and a positive bias voltage should be applied when the first conductivity type is n-type.

Light, incident on the photonic mixer device on the frontside or on the backside thereof, is absorbed in the substrate creating electron hole pairs. As the bias electrodes are only locally covering the outer edge of the respective biasing regions, the main part of the photosensitive area of the photonic multiplier is not covered by the bias electrodes. Hence, since the area of the bias electrodes is small compared to the photosensitive area, the quantum efficiency is not significantly adversely affected by the bias electrodes.

It is, moreover, an advantage of embodiments of the present invention that only the outer edges of the biasing regions are covered by the bias electrodes. If the complete surface would be covered this would lead to an increased power consumption and light signal loss.

In a second aspect embodiments of the present invention relate to a time of flight system which comprises a photonic mixer device in accordance with embodiments of the present invention.

In a third aspect embodiments of the present invention relate to a method for multiplying an optical signal with a reference electrical signal using a photonic mixer device in accordance with embodiments of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
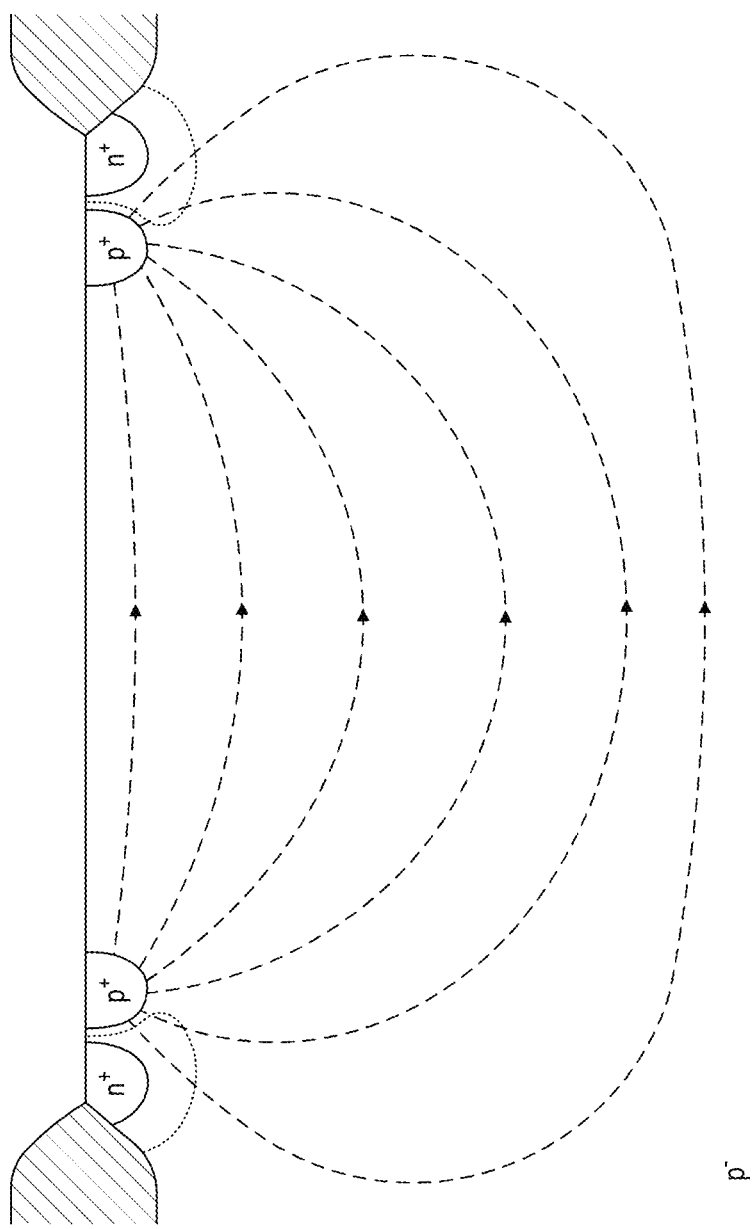
FIG. 1 shows a schematic drawing of a prior art current-assisted photonic demodulator.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 2:
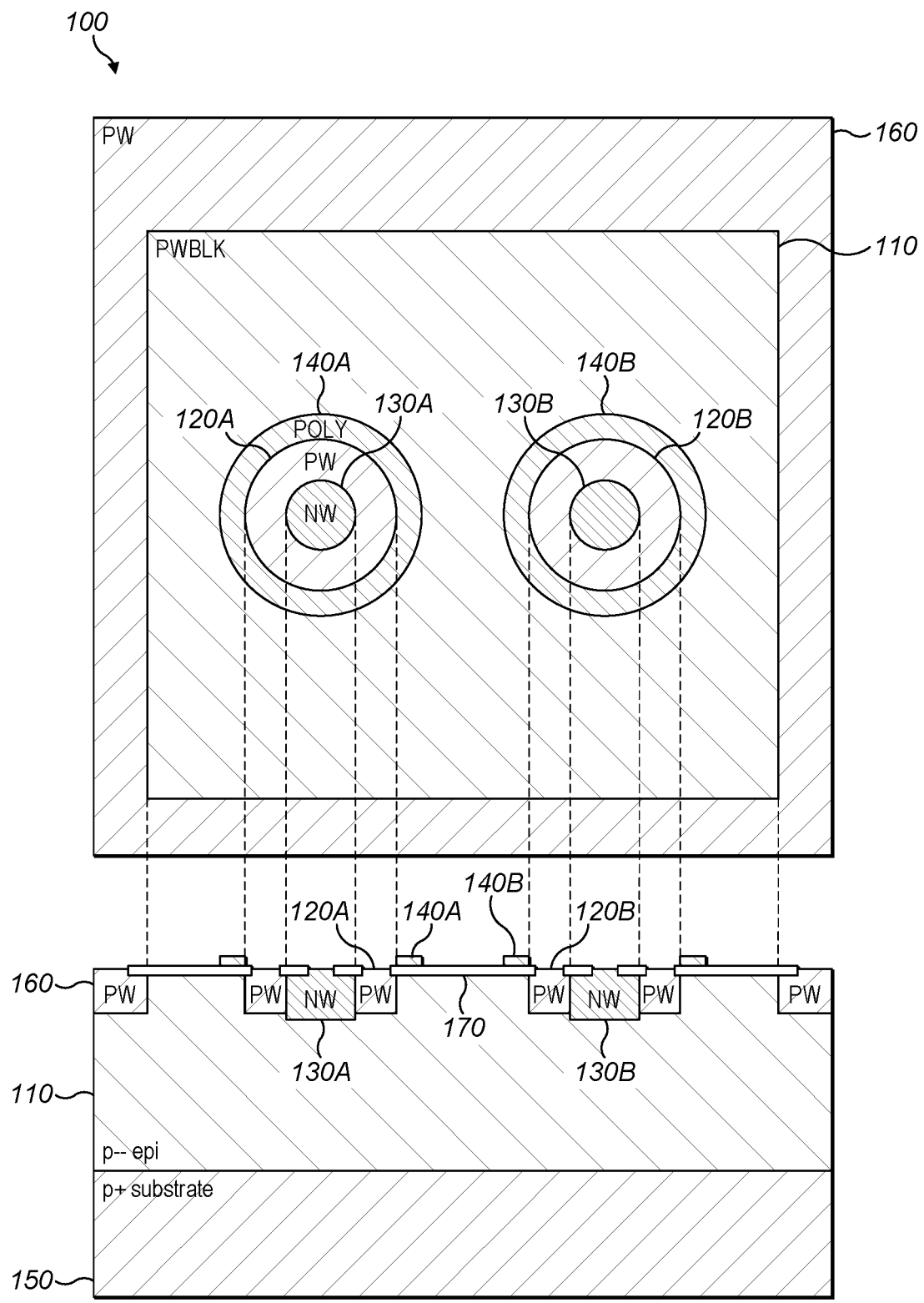
FIG. 2 shows a schematic drawing of the top view and side view of a photonic mixer device in accordance with embodiments of the present invention.

In a first aspect embodiments of the present invention relate to a photonic mixer device 100 for multiplying an impinging optical signal with a reference electrical signal. A schematic drawing of a top view and side view of an exemplary embodiment of such a device is shown in FIG. 2.

A photonic mixer device according to embodiments of the present invention comprises:
  a semiconductor substrate 110 of a first conductivity type,
  two detector regions 130A, 130B of a second conductivity type different from the first conductivity type,
  two biasing regions 120A, 120B of the first conductivity type with a higher dopant concentration than the dopant concentration of the semiconductor substrate 110, each biasing region positioned near one of the respective detector regions, wherein an electrical field can be formed in the semiconductor substrate 110 by applying a voltage bias between the biasing regions,
  two bias electrodes 140A, 140B, which are isolated from the substrate and the detector and the biasing regions, wherein each bias electrode is only locally, partially or completely, covering an outer edge of one of the respective biasing regions 120A, 120B. A first bias electrode 140A is locally covering the outer edge of a first biasing region 120A and a second bias electrode 140B is locally covering the outer edge of a second biasing region 120B.

The detector regions 130A, 130B are the first detector region 130A and the second detector region 130B, and the biasing regions are the first biasing region 120A, and the second biasing region 120B. The first biasing region 120A is positioned near the first detector region 130A and the second biasing region 120B is positioned near the second detector region 130B. Having a detecting region near a biasing region allows to drain the electron pool formed by applying a bias voltage between the biasing regions. The distance between the biasing region and the neighboring detection region may for example range between 0 and 2 µm. It may for example be 0.3 µm.

In embodiments of the present invention the first bias region 120A may be enclosing the first detector region 130A and the second bias region 120B may be enclosing the second detector region 130B.

The substrate 110 (with a dopant concentration of e.g. 1e13 $cm^{-3}$) may be an epitaxial layer grown on an underlying substrate 150 (with a dopant concentration of e.g. 1e17 $cm^{-3}$). The substrate 110 (with a dopant concentration of e.g.

1e13 cm$^{-3}$) may for example be a silicon substrate. The detector regions and biasing regions may for example have a dopant concentration of 1e17 cm$^{-3}$.

In the following paragraphs the invention as well as the advantages thereof will be explained in further detail.

Therefore, first the operation of the photonic mixer device in FIG. 1 is analyzed. The current that flows through the n regions corresponds to a product of the optical signal with the in-phase and out-of-phase electrical signal applied to the p regions. This current can consequently be integrated resulting in a correlation signal:

$$c_\phi = \int_0^{T_{int}} o(t-t_{TOF}) \cdot m(t-\Delta t_\phi) dt$$

where, $C_\phi$ is a correlation sample for $\phi$ phase shift between the optical signal o(t) and the electrical signal m(t) applied to the p regions, $\Delta t$ is the time delay of signal m(t) with respect to emitted optical signal causing the phase shift $\phi$, $T_{int}$ is the integration time, $t_{TOF}$ is time of flight.

Such a photonic mixer device may be used for a TOF distance measurement. During such a measurement, at least 3 correlation samples $c_\phi$ may be acquired. In practice, most often 4 samples are used producing the in-phase I=$c_0°$−$c_{180}°$ and quadrature component Q=$c_{90}°$−$c_{270}°$. For this case, the phase shift $\Phi_{TOF}$ caused by time of flight $t_{TOF}$ can be found as:

$$\phi_{TOF} = \arctan\frac{Q}{I}$$

The speed of a CAPD is defined by the average time $\underline{t}$ it takes for the photoelectrons to reach the n region. The average photoelectron path $\underline{d}$ is approximately proportional to the device size d, while the average electric field strength $\underline{E}$, assuming a constant voltage is applied to the p regions, is inversely proportional to the device size d. Therefore, the average speed is approximately inversely proportional to the device size squared d$^2$.

To increase the CAPD speed, the device dimensions should be minimized. If the device is operating at near infrared (NIR) wavelengths, optical signal confinement may be used to reduce the vertical dimension of a CAPD.

The layout of the CAPD may be optimized to reduce the average photoelectron path d. For example, by placing the p and n regions in the center of the device as shown in FIG. 2 the average photoelectron travel path can be reduced by a factor of up to 2 comparing to the linear layout shown in FIG. 1.

FIG. 2 shows biasing regions 120A, 120B and detector regions 130A, 130B in a substrate 110. In this example the substrate 110 is an epitaxial layer 110 of a first conductivity type grown on a substrate 150. The biasing regions are of the first conductivity type and the detector regions are of the second conductivity type. Each biasing region is surrounding one of the detector regions. An isolation layer 170 is present on the substrate 110 between a surrounding well 160 of the first conductivity type and the biasing regions of the first conductivity type, and between the detector regions and the biasing regions.

For example, for a 15 μm device shown in FIG. 2, biased by a 1V voltage source, its electron detection time can be approximately calculated as:

$$\underline{t} \approx \frac{\underline{d}}{\underline{E} \cdot \mu_e} \approx \frac{d^2}{V \cdot \mu_e} = \frac{7.5 \mu m^2}{1V \cdot 1400 \text{ cm}^2 V^{-1} s^{-1}} = 0.4 \text{ ns}$$

The above calculation gives a reasonable estimation of the average photoelectron detection time if the internal potential along the photoelectron travel paths towards n regions is monotonous and the electric field (V=$\underline{d}$) is constant along the photoelectron travel path.

In practice, however, this assumption does not always hold true.

Firstly, in case of near infrared (NIR) light, the optical signal can penetrate deep into the substrate 110 where the electric field is weaker. To overcome this effect, CAPD devices that are designed for NIR wavelengths typically need an extra negatively biased bottom electrode to create a vertical electric field component. Another option could be using optical signal confinement. In practice, typical speed at 850 nm for a CAPD without optical confinement is in the range of a few hundred MHz.

Secondly, it is noticed by the inventor that the assumption about monotonicity of the electrostatic potential may not hold in real devices leading to formation of charge pockets which deteriorate the device performance. The potential around the biasing region 120 (p region), connected to the higher voltage, may have a local maxima due to the effect of the STI fixed positive charge. The silicon field oxide interface (Si/oxide interface) has a positive surface-state charge which can vary in the order of $$\frac{1 \ldots 10 \times 10^{11} Q}{cm^2}$$

depending on the technological conditions. The first source of this charge typically is the interface itself which is positively charged. Besides that, during growth of the oxide some positive charges may get stuck in the oxide near this interface.

It was noticed by the inventor that the positive charges bend energy bands, thereby forming charge pockets around the biasing region 120 (p region). When these charge pockets are formed, the photoelectrons will end up in a local potential maximum and form a charge pool there. When the voltage between the biasing regions 120 is reversed, the electrons which are accumulated in this local potential maximum will end up in the wrong detector region 130. Hence, the charge pockets deteriorate the ability of the sensor to demodulate. An improved operation would be achieved if the field between the biasing regions were monotonic without charge pockets, which would result that all the photoelectrons drift to the correct collector 130 (one of the detector regions) before the voltage between the biasing regions 120 is reversed.

The power consumption of a CAPD device is defined by the substrate doping. To minimize the power consumption, preferably very low close to intrinsic doping levels are used. It is noticed by the inventor that for low doping levels, the charge pocket can extend deep into the silicon adversely affecting CAPD demodulation performance.

Figure 4:
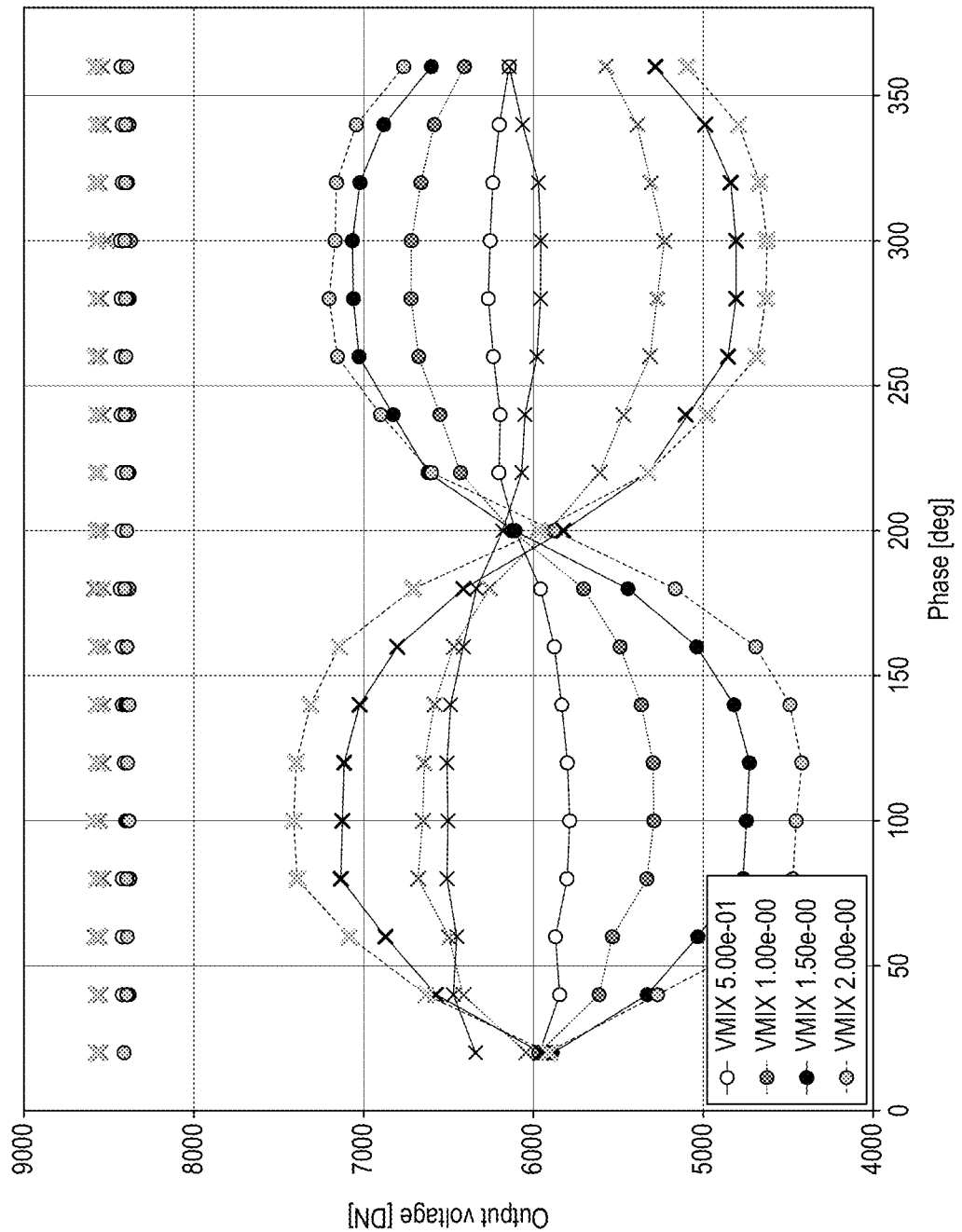
FIG. 4 shows a phase eye diagram at 50 MHz of a CAPD device affected by the charge pocket issue.

FIG. 4 shows a phase eye diagram at 50 MHz of a CAPD device affected by the charge pocket issue. The solid curves in FIG. 4 correspond to the photo signal due to the photocurrent flow through the detector regions 130 (in this example the n regions) for different phase shift between the optical impulse signal (train of 5 ns pulses with 20 ns repetition period) and the electrical square wave signal applied to the biasing regions 120 (in this example the p regions). The markers at the top of the plot represent the dark signal. The average current between the two detector regions 130A, 130B defines the CAPD quantum efficiency. The eye opening is a measure of CAPD demodulating capability. For a high performance demodulator, the eye in the phase eye diagram should be fully open with the photosignal reaching the dark level. As it can be seen from FIG. 4, the basic CAPD device, affected by the charge pocket issue, cannot fully demodulate the optical signal: the achievable demodulation contrast is in the range of 50%. For an ideal CAPD device, when a square wave is applied to the biasing regions 120A, 120B and when a light signal, also a square wave signal, is applied synchronously, at the backside or the frontside of the photonic mixer device, and when both are in phase, all photoelectrons are detected by one detector region and none by the other detector region.

Through simulations the inventor has found that the charge pockets are a cause of deterioration of the operation of the sensor and that these charge pockets are located at the outer edge of the biasing regions 120A, 120B. In case of a charge pocket issue, even when the light signal and the square wave on the biasing regions are in phase, some photoelectrons will go to the other contact. This will result in a narrowing of the eye as illustrated in FIG. 4.

The inventor has found that by providing bias electrodes 140A, 140B which are each only locally covering an outer edge of one of the respective biasing regions 120A, 120B and by providing a bias voltage, the charge pockets can be removed, and that as a result thereof the eye openings can be widened even if the electrode is not extending over the complete sensor.

Figure 5:
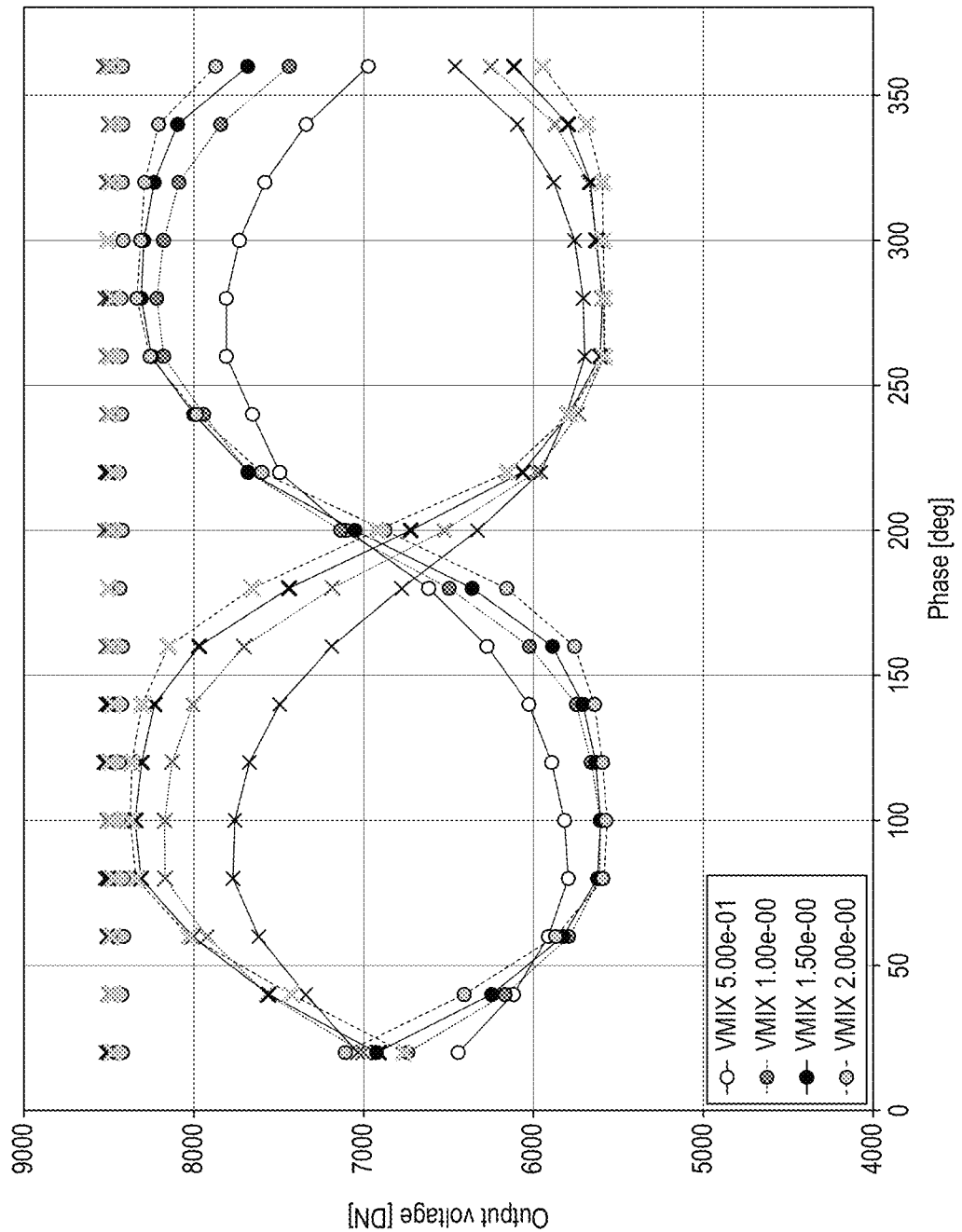
FIG. 5 shows the phase eye diagram of a CAPD covered with a polysilicon electrode covering the complete surface of the CAPD.

FIG. 5 shows the phase eye diagram of a CAPD covered with a polysilicon electrode (biased at −3V) covering the complete surface of the CAPD. The demodulating performance of this device is significantly improved compared to the CAPD device without the polysilicon electrode resulting in a demodulation contrast of about 90%.

However, this structure has significant disadvantages. Firstly, the device quantum efficiency is significantly lowered by the polysilicon electrode which creates 2 optical boundaries between silicon oxide and silicon. In that case more than 30% light power may be lost due to reflections. For a narrow spectral bandwidth light source, the optical power losses will be wavelength dependent due to constructive and destructive interference at the optical boundaries creating excessive spectral ripple.

In the example of FIG. 2 the bias electrodes 140A, 140B are donut shaped polysilicon electrodes. These are placed only around the edge of the biasing region 120 (in the example it is a p region) where the charge pocket is located. If this donut shaped electrode is negatively biased, the charge pocket is removed. Since the area of the donut electrode is small compared to the photosensitive area, the quantum efficiency is not adversely affected.

An additional advantage of the bias electrodes being present only locally over the outer edge of the biasing regions is that when biasing these electrodes, the bias voltage is only local just over the outer edge of the biasing regions. Thus, a current increase is avoided.

In the example of FIG. 2 the first conductivity is p-type. In that case a negative bias voltage should be applied to reduce the charge pockets. The invention is, however, not limited thereto. Alternatively, the first conductivity type may be n-type. In that case a positive bias voltage should be applied to reduce the charge pockets. In embodiments of the present invention, such as for example illustrated in FIG. 2, the bias electrodes 140A, 140B, are isolated from the substrate 110 by shallow trench isolation (STI) regions 170.

Figure 6:
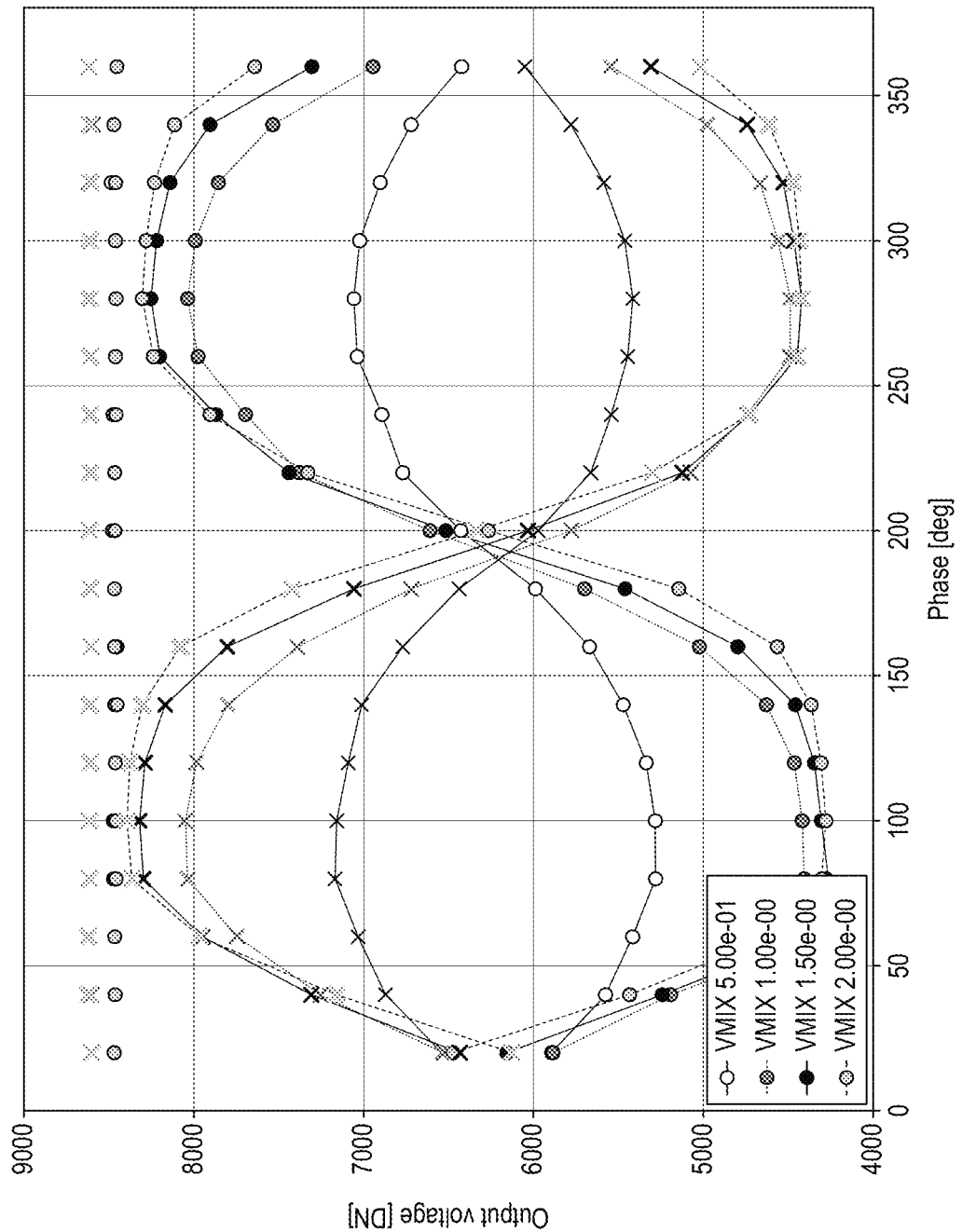
FIG. 6 shows a phase eye diagram of the CAPD sensor with a donut polysilicon electrode according to embodiments of the present invention.

FIG. 6 shows a phase eye diagram of the CAPD sensor with a donut polysilicon electrode (biased at −3V) according to embodiments of the present invention. This phase eye diagram illustrates a superior performance of the donut CAPD compared to the basic and polysilicon covered variants.

It is, moreover, an advantage of embodiments of the present invention that the power consumption thereof is reduced compared to photonic mixer devices of which the bias electrode is fully covering the photonic mixer device. A negatively biased polysilicon electrode creates a hole accumulation layer under the isolation layer 170. In case of a fully covered CAPD, such an accumulation layer is created under the whole photosensitive area leading to a higher current consumption between p regions.

The bias electrodes may for example be polysilicon electrodes, or metal electrodes. It is an advantage of embodiments of the present invention that also metal electrodes can be used. This is possible because the bias electrodes are only locally covering the outer edges of the respective biasing regions.

The total surface of the bias electrodes may for example be less than 10% of the photosensitive area of the photonic mixer device. Where in embodiments of the present invention reference is made to the photosensitive area of the photonic mixer device reference is made to the area through which the light can penetrate to the substrate 110.

The bias electrodes may for example have a ring-shape or a square-shape. The sizes of the detector regions and biasing regions are mostly defined by the technology used. The size of the biasing regions is selected as small as possible so that it minimizes the current consumption. The bias electrodes may overlap with the biasing regions. They should go over the outer edge of the biasing regions such that they are covering the charge pockets and such that the charge pockets can be removed when biasing them. The bias electrodes may for example have the form of a donut shaped ring. The donut shaped ring may have an outer diameter of 1 µm.

A photonic mixer device 100 according to embodiments of the present invention may comprise a controller 180. An example of a photonic mixer device comprising such a controller 180 is schematically drawn in FIG. 3. The controller is configured for:
applying the reference electrical signal as a biasing voltage between the biasing regions 120A, 120B, and for applying a negative bias on the bias electrodes 140A, 140B when the first conductivity type is p-type, or a positive bias on the bias electrodes 140A, 140B when the first conductivity type is n-type.

The controller 180, moreover, comprises a current measurement device 182 connected with the two detector regions 130A, 130B and is adapted for measuring a photogeneration current generated by the photonic mixer device.

Figure 3:
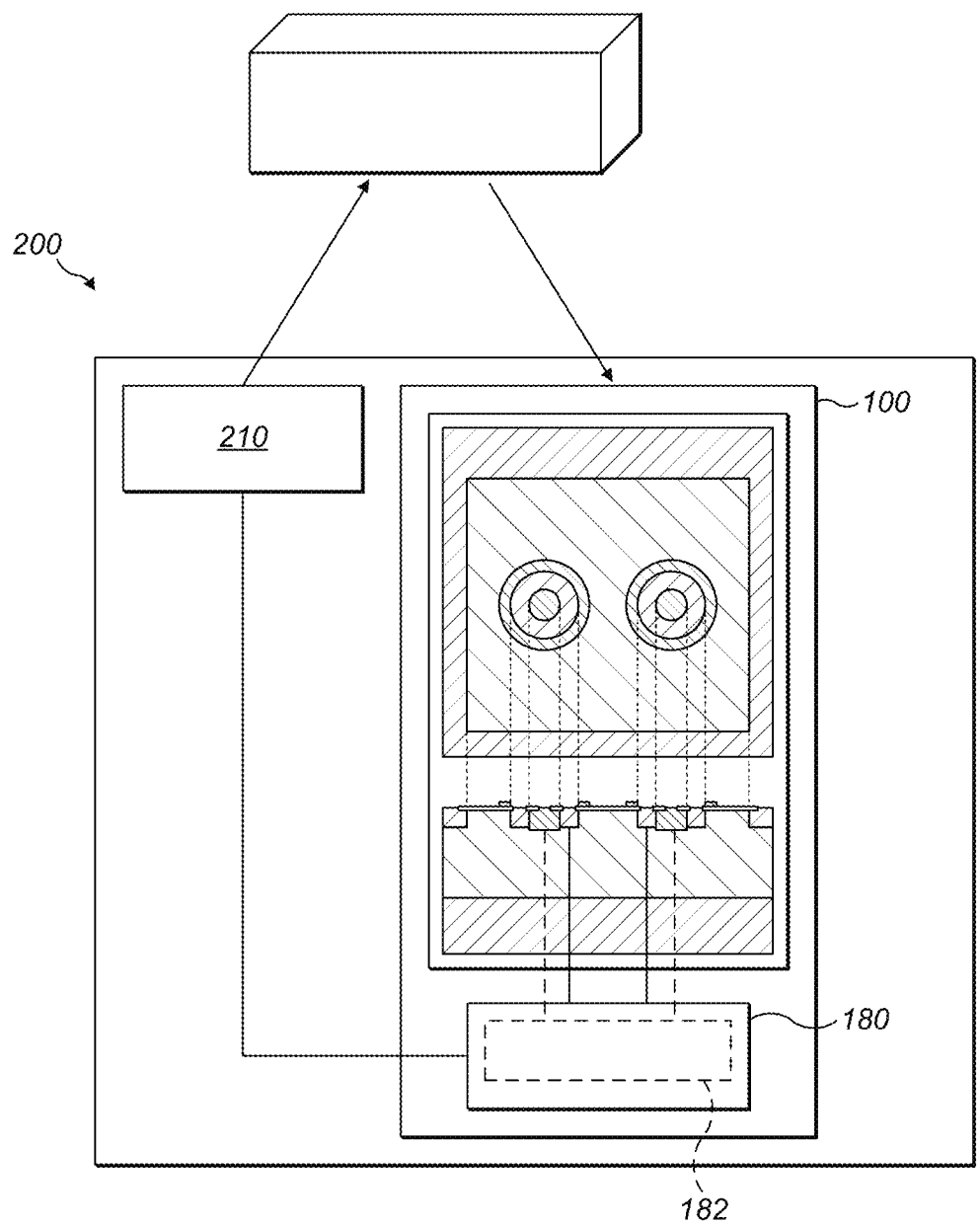
FIG. 3 shows a schematic drawing of a time of flight system in accordance with embodiments of the present invention.

In a second aspect embodiments of the present invention relate to a time of flight system 200. An example of such a time of flight system is schematically illustrated in FIG. 3. The time of flight system comprises a photonic mixer device 100 in accordance with embodiments of the present invention, and a light source 210 configured for generating a modulated optical signal. The photonic mixer device 100 is positioned for receiving the optical signal and the time of flight system is configured for generating the reference electrical signal. In embodiments of the present invention the time of flight system is configured for calculating the time delay between the reference signal and the received optical signal based on the measured photogeneration current. In embodiments of the present invention the impinging optical signal may be a reflected version of the generated optical signal.

In a third aspect embodiments of the present invention relate to a method for multiplying an optical signal with a reference electrical signal. The method comprises:
provideing a photonic mixer device 100 according to embodiments of the present invention,
transmitting a modulated optical signal such that it impinges on the photonic mixer device,
providing a reference signal over the two biasing regions, while applying a negative bias on the bias electrodes 140A, 140B when the first conductivity type is p-type, or while applying a positive bias on the bias electrodes 140A, 140B when the first conductivity type is n-type. The reference signal may be applied as a bias voltage over the two biasing regions.

In embodiments of the present invention the modulated optical signal is reflected before it impinges on the photonic mixer device. By determining the time delay between the reference signal and the received optical signal based on the measured photogeneration current the distance to the object on which the optical signal is reflected may be obtained. In embodiments of the present invention the reference signal and the optical signal are synchronous. In embodiments of the present invention the reference and the optical signal start at the same time but may have different parameters like base frequency, shape and amplitude.

The invention claimed is:

1. A photonic mixer device for multiplying an impinging optical signal with a reference electrical signal, the photonic mixer device comprising:
a semiconductor substrate of a first conductivity type,
two detector regions of a second conductivity type different from the first conductivity type,
two biasing regions of the first conductivity type with a higher dopant concentration than the dopant concentration of the semiconductor substrate, each biasing region positioned near one of the respective detector regions, wherein an electrical field can be formed in the semiconductor substrate by applying a voltage bias between the biasing regions,
two bias electrodes, which are isolated from the substrate and the biasing regions, wherein each bias electrode is only locally, partially or completely, covering an outer edge of one of the respective biasing regions, such that when biasing the bias electrodes with a bias voltage, the bias voltage is only local just over the outer edge of the biasing regions and such that the bias electrodes are covering charge pockets which are present in an electrostatic potential between the biasing regions underneath the outer edges of the biasing regions.

2. The photonic mixer device according to claim 1, wherein the bias regions are enclosing the detector regions.

3. The photonic mixer device according to claim 1, wherein the outer edges of the biasing regions are substantially circular and wherein the bias electrodes have a substantially circular donut shape.

4. The photonic mixer device according to claim 1, wherein the outer edges of the biasing regions are substantially rectangular and wherein the bias electrodes have a substantially rectangular donut shape.

5. The photonic mixer device according to claim 1, wherein the semiconductor substrate is a silicon substrate.

6. The photonic mixer device according to claim 1, wherein the first conductivity type is n-type and wherein the second conductivity type is p-type.

7. The photonic mixer device according to claim 1, wherein the first conductivity type is p-type and wherein the second conductivity type is n-type.

8. The photonic mixer device according to claim 1, wherein the bias electrodes are isolated from the substrate by shallow trench isolated regions.

9. The photonic mixer device according to claim 1, wherein the bias electrodes are polysilicon electrodes.

10. The photonic mixer device according to claim 1, wherein the bias electrodes are metal electrodes.

11. The photonic mixer device according to claim 1, wherein a total surface of the bias electrodes is less than 10% of a photosensitive area of the photonic mixer device.

12. The photonic mixer device according to claim 1, the photonic mixer device comprising a controller which is configured for:
applying the reference electrical signal as a biasing voltage between the biasing regions, and for
applying a negative bias on the bias electrodes when the first conductivity type is p-type, or a positive bias on the bias electrodes when the first conductivity type is n-type, and wherein
the controller comprises a current measurement device connected with the two detector regions and adapted for measuring a photogeneration current generated by the photonic mixer device.

13. The time of flight system, the time of flight system comprising a photonic mixer device according to claim 12, and a light source configured for generating a modulated optical signal, wherein the photonic mixer device is positioned for receiving the optical signal and
wherein the time of flight system is configured for generating the reference electrical signal and calculating the time delay between this reference signal and the received optical signal based on the measured photogeneration current.

14. The method for multiplying an optical signal with a reference electrical signal, the method comprising:
providing a photonic mixer device according to claim 1,
transmitting a modulated optical signal such that it impinges on the photonic mixer device,
providing a reference signal over the two biasing regions while applying a negative bias on the bias electrodes when the first conductivity type is p-type, or while applying a positive bias on the bias electrodes when the first conductivity type is n-type.

* * * * *